(12) United States Patent
Fann et al.

(10) Patent No.: US 8,921,679 B2
(45) Date of Patent: Dec. 30, 2014

(54) THERMOELECTRIC MODULE AND METHOD OF FABRICATING THE SAME (71) Applicant: Industrial Technology Research Institute, Hsinchu (TW)

(72) Inventors: Yuan-Chang Fann, Jhudong Township (TW); Chun-Mu Chen, Baoshan Township (TW); Chih-Hao Chang, Longtan Township (TW); Tse-Hsiao Lee, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/728,779

(22) Filed: Dec. 27, 2012

(65) Prior Publication Data

US 2013/0167896 A1   Jul. 4, 2013

(30) Foreign Application Priority Data

Dec. 30, 2011  (TW) ............................. 100149764 A (51) Int. Cl.
*H01L 35/32* (2006.01)
*H01L 35/08* (2006.01)
*H01L 35/34* (2006.01)

(52) U.S. Cl.
CPC ............. *H01L 35/325* (2013.01); *H01L 35/34* (2013.01); *H01L 35/08* (2013.01); *H01L 35/32* (2013.01)
USPC ............................. 136/227; 136/224; 136/244

(58) Field of Classification Search
CPC ....... H01L 35/32; H01L 35/34; H01L 35/325; H01L 35/08
USPC .......................... 136/227, 224, 244; 228/180.1
See application file for complete search history.

(56) References Cited

U.S. PATENT DOCUMENTS 6,673,996 B2    1/2004  Caillat et al.
2002/0189661 A1  12/2002  Caillat et al.
(Continued)

FOREIGN PATENT DOCUMENTS

EP        1193774 A1      3/2002
JP     2010-108958 A      5/2010
WO  WO 2011102498 A2 *   8/2011

OTHER PUBLICATIONS

Flandorfer et al., "Interfaces in lead-free solder alloys: Enthalpy of formation of binary Ag—Sn, Cu—Sn and Ni—Sn intermetallic compounds", Thermochimica Acta, vol. 459, (2007), pp. 34-39.*

(Continued)

*Primary Examiner* — Jeffrey T Barton
*Assistant Examiner* — Tae-Sik Kang
(74) *Attorney, Agent, or Firm* — Birch, Stewart, Kolasch & Birch, LLP (57) ABSTRACT

The disclosure provides a thermoelectric module and a method for fabricating the same. The thermoelectric module includes a plurality of p-type and n-type segmented thermoelectric elements disposed in a planar array, wherein the p-type and n-type segmented thermoelectric elements are coupled in series via a plurality of first electrodes and second electrodes. Each segmented thermoelectric element includes at least two vertically homogeneous thermoelectric segments, and at least two adjacent thermoelectric segments have a fusion-bonding layer therebetween. The fusion-bonding layer includes a tin-containing material and a plurality of spacers disposed among the tin-containing material, wherein the melting point of the spacers is higher than the liquidus temperature of the tin-containing material.

18 Claims, 5 Drawing Sheets

(56) References Cited

U.S. PATENT DOCUMENTS

| | | | |
|---|---|---|---|
| 2003/0042819 A1* | 3/2003 | Martinovsky et al. | 310/306 |
| 2005/0045702 A1* | 3/2005 | Freeman et al. | 228/254 |
| 2008/0060693 A1 | 3/2008 | Sterzel | |
| 2008/0271772 A1 | 11/2008 | Leonov et al. | |
| 2009/0032080 A1* | 2/2009 | Kawauchi et al. | 136/224 |
| 2010/0229911 A1* | 9/2010 | Leavitt et al. | 136/239 |
| 2010/0319744 A1* | 12/2010 | Smythe et al. | 136/201 |
| 2010/0319746 A1 | 12/2010 | Snyder et al. | |
| 2012/0167937 A1* | 7/2012 | Fann et al. | 136/224 |
| 2013/0032188 A1* | 2/2013 | Kajihara et al. | 136/200 |

OTHER PUBLICATIONS

Bo Brummerstedt Iversen, "Fulfilling thermoelectric promises: b-Zn4Sb3 from materials research to power generation", J. Mater. Chem., vol. 20, (2010), pp. 10778-10787.*

Fujimoto et al., JP 2009231317 A, English Machine Translation, Japan, pp. 1-25.*

Zeng et al., "Development of high-temperature solders: Review", Microelectronics Reliability 52 (2012) pp. 1306-1322.*

Garelick Steel, "Melting Points of Common Metals", www.garelicksteel.com, [online], [retrieved on Jun. 17, 2014]. Retrieved from the Internet<URL: http://www.garelicksteel.com/pdfs/Melting_Points_of_Common_Metals.pdf>, p. 1.*

Office Action for corresponding Taiwanese Application No. 100149794 dated May 15, 2014 is provided.

Anatychuk, et al., "Segmented Generator Modules Using Bi2Te3-Based Materials", Journal of Electronic Materials, 2011, 5 pages.

Caillat, et al., "Progress in the Development of High-Efficiency Segmented Thermoelectric Generators", 5 pages.

Lazard, et al., "Some Considerations Towards Design and Optimization of Segmented Thermoelectric Generators", the 5th European Conference on Thermoelectrics Odessa House of Scientists, Sep. 10-12, 2007, 4 pages, Odessa, Ukraine.

Snyder, et al., "Using the Compatibility Factor to Design High Efficiency Segmented Thermoelectric Generators", Materials Research Society Fall 2003 Meeting, Dec. 1-5, 2003, pp. 1-6, Boston, MA.

Zybala, et al., "Junctions and Diffusion Barriers for High Temperature Thermoelectric Modules", Materialy Ceramiczne/Ceramic Materials, 2010, pp. 481-485, vol. 62, 4.

TW Office Action dated Aug. 6, 2014. pp. 1-6.

* cited by examiner

THERMOELECTRIC MODULE AND METHOD OF FABRICATING THE SAME

CROSS REFERENCE TO RELATED APPLICATIONS

This application is based upon and claims the benefit of priority from the prior Taiwan Patent Application No. 100149764, filed on Dec. 30, 2011, the entire contents of which are incorporated herein by reference.

BACKGROUND

1. Field

The technical field relates to a thermoelectric module and a method for fabricating the same, and in particular to a thermoelectric module having segmented thermoelectric elements and a method for fabricating the same.

2. Description

Many homogeneous thermoelectric compounds suitable for different temperature ranges have been studied over decades, but no single homogeneous thermoelectric compound exhibits an uniform high figure-of-merit over a wide temperature range, e.g. such as between 80° C. and 600° C. This common shortcoming of such homogeneous thermoelectric materials limits the generation efficiency of prior art thermoelectric modules because of the low mean figure-of-merit.

In order to enhance the generation efficiency of the thermoelectric module, forming the segmented thermoelectric elements by bonding the appropriate homogeneous thermoelectric materials from suitable low-temperature to high-temperature range is a reasonable option. Processes of welding stacked heterogeneous bulk materials, hot-pressed bonding stacked heterogeneous bulk materials with fusion metallic filler, and hot-compression sintering stacked heterogeneous powder materials, can be used to fabricate the segmented thermoelectric elements/materials with higher thermal to electricity conversion efficiency.

However, the above-mentioned thermoelectric module will generate a high twist thermal stress/strain during a wide temperature gradient operation, resulting in the possibility of a peel-off between those segmented thermoelectric elements and corresponding electrodes and/or failure of segmented thermoelectric elements. Therefore, a segmented thermoelectric element with appropriate cushioned structure helps to accommodate the thermal stress. Among the feasible processes of segmented thermoelectric elements/materials, the fusion-bonding process is an option to meet the requirement, but several prerequisites can be reached.

The fusion process temperature can be as low as possible, in order to avoid the deterioration of figure-of-merit of the thermoelectric materials (for example, comprising highly volatile tellurium, and in order to avoid the phase transformation of the thermoelectric materials). The fusion-bonding layer formed at low process temperature maintains its thickness even in semi-solid state in order to withstand a higher service temperature, which is higher than the fusion process temperature. And, relationship related accommodating the thermal stress and fusion-bonding layer function as a cushion, the thicker the fusion-bonding layer is, and the lower Young's modulus of the fusion-bonding layer is, the more easily the fusion-bonding layer accommodates the thermal stress.

Accordingly, it is a trend to develop a thermoelectric module with novel segmented thermoelectric elements therein which are jointed by fusion-bonding process to withstand high service temperature.

BRIEF SUMMARY

An exemplary embodiment of the disclosure provides a thermoelectric module, including a plurality of p-type and n-type segmented thermoelectric elements disposed in a planar array, wherein the p-type and n-type segmented thermoelectric elements are coupled in series via a plurality of first electrodes and second electrodes, and each segmented thermoelectric element includes at least two vertically homogeneous thermoelectric segments, and said two adjacent thermoelectric segments have a fusion-bonding layer therebetween, and wherein the fusion-bonding layer includes: a tin-containing material; and a plurality of spacers disposed among the tin-containing material, wherein the spacers can be made of Fe, Co, Ni, Cr, Ti, Mn, Ag, Cu, or a combination thereof, and the melting point of the spacers is higher than the liquidus temperature of the tin-containing material.

According to other embodiments of the disclosure, a method for fabricating the aforementioned thermoelectric module is provided. The method includes providing a plurality of p-type segmented thermoelectric elements, and a plurality of n-type segmented thermoelectric elements, wherein each segmented thermoelectric element comprises at least two thermoelectric segments vertically stacked together, wherein a fusion-bonding layer is disposed between said two adjacent thermoelectric segments. The fusion-bonding layer comprises a tin-containing material and a plurality of spacers disposed among the tin-containing material, wherein the spacers can be made of Fe, Co, Ni, Cr, Ti, Mn, Ag, Cu, or a combination thereof, and the melting point of the spacers is higher than the liquidus temperature of the tin-containing material. The method includes alternately arranging the p-type segmented thermoelectric elements and the n-type segmented thermoelectric elements to form a planar array and providing a plurality of first electrodes to contact bottom ends of the p-type segmented thermoelectric elements and the n-type segmented thermoelectric elements. The method includes providing a plurality of second electrodes to contact top ends of the p-type segmented thermoelectric elements and the n-type segmented thermoelectric elements, forcing the p-type segmented thermoelectric elements to couple to the n-type segmented thermoelectric elements in series.

A detailed description is given in the following embodiments with reference to the accompanying drawings.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a thermoelectric module with p-type and n-type segmented thermoelectric elements, and a method for fabricating the thermoelectric module. Each p-type and n-type segmented thermoelectric element includes at least two vertically homogeneous thermoelectric segments, and said two adjacent thermoelectric segments have a fusion-bonding layer therebetween. The fusion-bonding layer includes a tin-containing material and a plurality of spacers disposed among the tin-containing material. Herein, the host atoms of the tin-containing material (the term "host atom" means the major content element of the tin-containing material) can be tin, lead, copper, or silver atoms, and the spacers can be made of Fe, Co, Ni, Cr, Ti, Mn, Ag, Cu, or a combination thereof. It should be noted that the melting point of the spacers is higher than the liquidus temperature of the tin-containing material. The spacers can maintain solid state even though the tin-containing material is melted into a liquid state, or a semi-solid state during a hot-pressed bonding process, thereby preventing the melting tin-containing material from overflowing the interface between the two adjacent thermoelectric segments under a clamp force of the hot-pressed bonding process. Furthermore, the spacers of the fusion-bonding layer can help maintain the height of the segmented thermoelectric elements to be nearly constant and function as stabilizing the thickness of the fusion-bonding layer during the hot-pressed bonding process or the over-temperature operation of the thermoelectric module. Therefore, the yield of fabricating the segmented thermoelectric elements is increased. Moreover, when bonding the segmented thermoelectric elements in the hot-pressed bonding process, the metallic atoms of the spacer and the tin atoms of melting tin-containing material may inter-diffuse to form intermetallic compounds (having a melting point of between 480-1450° C. and about submicron to micron meter size). The amount of the obtained intermetallic compounds is proportional to the volume ratio of the spacer. After the intermetallic compounds reaction, the consumed tin help increase the melting temperature of the fusion-bonding layer after the hot-pressed bonding process. Hence, the segmented thermoelectric elements of the disclosure can be fixed under lower temperatures, and the thermoelectric module can be operated under higher temperatures due to the formation of high-temperature intermetallic compounds and the accompanied effect of the consumed molten tin content in the fusion-bonding layer.

The thermoelectric module of the disclosure includes a plurality of p-type and n-type segmented thermoelectric elements. Each segmented thermoelectric element includes at least two vertically homogeneous thermoelectric segments. The two adjacent thermoelectric segments have a fusion-bonding layer therebetween for bonding the two adjacent thermoelectric segments. It should be noted that the fusion-bonding layer includes a tin-containing material and a spacer, wherein the spacers are disposed among the tin-containing material, and the spacer can be made of Fe, Co, Ni, Cr, Ti, Mn, Ag, Cu, or a combination thereof. The melting point of the spacers is higher than the liquidus temperature of the tin-containing material. The volume ratio of the spacer can be about 4-50 vol. % or about 7-15 vol. %, based on the volume of the fusion-bonding layer. The tin-containing material can be tin, a tin-silver alloy, tin-bismuth alloy, tin-silver-copper alloy, lead-tin-silver alloy, silver-copper-tin-bismuth alloy, or silver-copper-tin-zinc alloy. The tin-containing material can also be a metal paste such as tin paste, lead paste, or silver paste. For example, when the segmented thermoelectric element includes $\beta$-$Zn_4Sb_3$, the tin-containing material can be a tin-silver-copper alloy or lead-silver-tin alloy with a melting point less than the melting point of zinc, thereby preventing $\beta$-$Zn_4Sb_3$ from phase transformation. According to some embodiments of the disclosure, the spacer can be a particle-shaped spacer, a strip-shaped spacer, or a combination thereof. The strip-shaped spacer can have a height of between about 50-1000 μm or about 50-500 μm, and the ratio between the height of the strip-shaped spacer and the thickness of the fusion-bonding layer can be between 0.5-1. Furthermore, the aspect ratio of the strip-shaped spacer can be between 20 and 500. In one embodiment, the particle-shaped spacer can have a single particle size. In another embodiment, the spacers can include at least two particle-shaped spacers with different particle sizes. In one embodiment, the ratio between the particle size of the particle-shaped spacer and thickness of the fusion-bonding layer can be about 0.1-1. The aspect ratio of the particle-shaped spacers can be about 1-10. The spacer can be a material, which is apt to react with the molten tin-containing material to form an intermetallic compound. The spacer can be made of Fe, Co, Ni, Cr, Ti, Mn, Ag, Cu, or a combination thereof, such as nickel-chromium alloy, or nickel powder covered by copper. Furthermore, the spacer can also be a metal or ceramic material covered by Fe, Co, Ni, Cr, Ti, Mn, Ag, Cu, or an alloy thereof.

For enhancing the wettability with the molten tin-containing material, a wetting metal (such as gold, silver, or nickel) can be further formed to cover the outer surface of the spacer. The shape of the spacer is unlimited, and can be circular, ellipse-shaped, polyhedral, or a combination thereof. The height or the particle size of the spacer can be about 5-500 μm. It should be noted that the metal atoms (such as nickel atoms) of the spacer are apt to react with the melting tin-containing material (tin in a liquid state) to form intermetallic compounds during the hot-pressed bonding process. Therefore, the fusion-bonding layer can further include intermetallic compounds, and the intermetallic compounds can be $Ni_3Sn_4$, $Ni_3Sn_2$, $Cr_2Sn_3$, $Co_3Sn_2$, $CoSn$, $CoSn_2$, $Co_3Sn$, $CoSn_2$, $Fe_5Sn_3$, $Fe_3Sn_2$, $FeSn$, $FeSn_2$, $Fe_3Sn$, $Ni_3Sn_2$, $Ti_3Sn$, $Ti_2Sn$, $Ti_5Sn_3$, $Ti_6Sn_5$, $Mn_2Sn$, $Mn_3Sn$, $Ag_5Sn$, $Ag_3Sn$, or $Cu_5Sn_6$.

Methods for forming a fusion-bonding layer with spacers are unlimited. For example, strip-shaped or particle-shaped spacers can be combined with a sheet-shaped tin-containing material via a compression molding process. Furthermore, a strip-shaped spacer can be combined with a sheet-shaped tin-containing material via a twisting motion. According to other embodiments of the disclosure, particle-shaped spacers can be combined with a tin-containing material paste by mixing them together, and the particle-shaped spacers can have different particle sizes. According to another embodiments of the disclosure, a net-shaped spacer can be directly disposed on the sheet-shaped tin-containing material, or a tin-containing material paste can be coated on the surface of the net-shaped spacer.

The thermoelectric module of the disclosure can further include a plurality of first electrodes, wherein the plurality of p-type or n-type segmented thermoelectric elements are disposed on the top surface of the first electrodes; and a plurality of second electrodes are disposed on the top surface of the top thermoelectric segments of the plurality of segmented thermoelectric elements. A first soldering layer is disposed between the first electrode and the bottom thermoelectric segment of the segmented thermoelectric element, and a second soldering layer or a brazing layer is disposed between the second electrode and the top thermoelectric segment of the segmented thermoelectric element.

The method for fabricating the thermoelectric module of the disclosure can include the following steps:

(a) A plurality of p-type segmented thermoelectric elements and a plurality of n-type segmented thermoelectric elements are provided. The method for fabricating the p-type and n-type segmented thermoelectric elements includes (1) forming low-temperature thermoelectric segments, mid-temperature thermoelectric segments, and high-temperature thermoelectric segments separately or forming low-temperature thermoelectric segments, and forming thermoelectric segments each bonding a mid-temperature thermoelectric segment and a high-temperature thermoelectric segment. For example, the low-temperature thermoelectric segments can be fabricated by subjecting $Bi_2Te_3$ based material to a zone melting process, a hot extrusion process, or a powder sintering process, and the mid-temperature thermoelectric segments and the high-temperature thermoelectric segments can be fabricated separately by subjecting $\beta$-$Zn_4Sb_3$, PbTe, or $CoSb_3$ based material to a powder sintering process. The thermoelectric segments obtained can be further subjected to an electroplating process, forming an anti-diffusion layer (with a thickness of 2-10 μm) covering the surface of the thermoelectric segments. The material of the anti-diffusion layer can be Ni. Further, during the hot-pressed bonding process for bonding the thermoelectric segments, the anti-diffusion layer (with a thickness of 100-2000 μm or 40-2000 μm) can be formed on the surface of the thermoelectric segments by thermoelectric segments in advance. For example, the process about molding the thermoelectric segments each bonding a mid-temperature thermoelectric segment and a high-temperature thermoelectric segment can be completed via co-sintering stacked heterogeneous powder materials comprising anti-diffusion metal powder, mid-temperature thermoelectric powder, anti-diffusion metal powder, high-temperature thermoelectric powder, and anti-diffusion metal powder sequentially; (2) forming a fusion-bonding layer precursor, wherein the fusion-bonding layer precursor includes a tin-containing material, and spacers. The spacer can be made of Fe, Co, Ni, Cr, Ti, Mn, Ag, Cu, or a combination thereof, and the melting point of the spacers is higher than the liquidus temperature of the tin-containing material; (3) vertically stacking at least two of the same type thermoelectric segments, and disposing the fusion-bonding layer precursor between each two adjacent thermoelectric segments; and (4) bonding the vertically stacked thermoelectric segments via a hot-pressed bonding process, thereby forcing the fusion-bonding layer precursor to form a fusion-bonding layer for bonding the thermoelectric segments to form the segmented thermoelectric element.

(b) The p-type segmented thermoelectric elements and the n-type segmented thermoelectric elements are alternately arranged to form an array.

(c) A plurality of first electrodes are provided to contact the bottom ends of the p-type segmented thermoelectric elements and the n-type segmented thermoelectric elements, and a plurality of second electrodes are provided to contact the top ends of the p-type segmented thermoelectric elements and the n-type segmented thermoelectric elements, forcing the p-type segmented thermoelectric elements to couple to the n-type segmented thermoelectric elements in series. The bottom end of the p-type segmented thermoelectric element (or the bottom end of the n-type segmented thermoelectric element) can be bonded to the first electrode via a first soldering layer, and the top end of the p-type segmented thermoelectric element (or the top end of the n-type segmented thermoelectric element) can be bonded to the second electrode via a second soldering layer or a brazing layer.

The following embodiments are intended to illustrate the disclosure more fully without limiting the scope of the disclosure, since numerous modifications and variations will be apparent to those skilled in this art.

Thermoelectric Module

Figure 1:
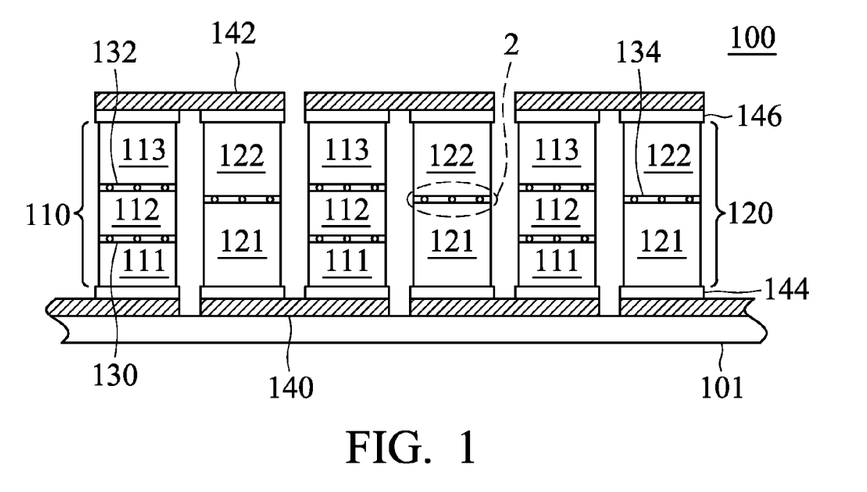
FIG. 1 is a cross-section of a thermoelectric module 100 according to an embodiment of the disclosure.

FIG. 1 is a cross-section of a thermoelectric module 100 according to an embodiment of the disclosure. The thermoelectric module 100 includes a substrate 101, a plurality of p-type segmented thermoelectric elements 110, a plurality of n-type segmented thermoelectric elements 120, a plurality of first electrodes 140, a plurality of second electrodes 142, a plurality of first soldering layers 144, and a plurality of second soldering layers 146. As shown in FIG. 1, the plurality of p-type segmented thermoelectric elements 110 and n-type segmented thermoelectric elements 120 are alternately arranged and disposed between the first electrodes 140 and the second electrodes 142. The plurality of first electrodes 140 (such as a copper electrode coated with Ni, Ag or Au) are disposed on the first substrate 101 (which can be a ceramic substrate, such as an alumina substrate), and the p-type segmented thermoelectric element 110 and the n-type segmented thermoelectric element 120 can be disposed on each first electrode 140. In another embodiment, for making an electrical connection, a single p-type segmented thermoelectric element 110 (or a single n-type segmented thermoelectric element 120) and a wire (not shown) can be disposed on one of the first electrodes. The p-type segmented thermoelectric element 110 (or the n-type segmented thermoelectric element 120) is bonded to the first electrode 140 via a first soldering layer 144 (silver-tin alloy solder) and electrically connected to the first electrode 140. Each second electrode 142 (such a Fe electrode coated with a Sn film) covers the top ends of the p-type segmented thermoelectric element 110 and the n-type segmented thermoelectric element 120.

Furthermore, the p-type segmented thermoelectric element 110 (or the n-type segmented thermoelectric element 120) is bonded to the second electrode 142 via a second soldering layer 146 (silver-tin alloy solder) and electrically connected to the second electrode 142. Accordingly, as shown in FIG. 1, the plurality of p-type segmented thermoelectric elements 110 and the plurality of n-type segmented thermoelectric elements 120 are alternately disposed on the first substrate 101. Therefore, each p-type segmented thermoelectric element 110 is electrically connected to the adjacent n-type segmented thermoelectric element 120 via the first electrode 140 (or the second electrode 142), forcing the p-type segmented thermoelectric elements to couple to the n-type segmented thermoelectric elements in series.

Still shown in FIG. 1, the p-type segmented thermoelectric element 110 can include a plurality (such as two or at least two) of thermoelectric segments. Herein, the p-type segmented thermoelectric element 110 includes three p-type thermoelectric segments stacked together, wherein the three homogeneous thermoelectric segments are made of different materials. The three thermoelectric segments can include low-temperature thermoelectric segments 111 (made of, for example, $Bi_xSb_{2-x}Te_3$ (x=0.35~0.65), such as $Bi_{0.5}Sb_{1.5}Te_3$), mid-temperature thermoelectric segments 112 (made of, for example, $\beta$-$Zn_4Sb_3$), and high-temperature thermoelectric segments 113 ((made of, for example, $Pb_{1-z}Sn_zTe$ (z=0~0.6)). It should be noted that, in the thermoelectric module 100 of the disclosure, a fusion-bonding layer can be disposed between each two adjacent thermoelectric segments. In this embodiment, the low-temperature thermoelectric segments 111 and the mid-temperature thermoelectric segments 112 are bonded via a first fusion-bonding layer 130, and the mid-temperature thermoelectric segments 112 and the high-temperature thermoelectric segments 113 are bonded via a second fusion-bonding layer 132. On the other hand, the n-type segmented thermoelectric element 120 can include a plurality (such as two or at least two) of thermoelectric segments.

Herein, the n-type segmented thermoelectric element 120 includes two n-type thermoelectric segments stacked together, wherein the two homogeneous thermoelectric segments are made of different materials. The two thermoelectric segments can include low-temperature thermoelectric segments 121 (made of, for example, $Bi_2Te_ySe_{3-y}$ (y=0.1~0.9), such as $Bi_2Te_{2.55}Se_{0.45}$), and high-temperature thermoelectric segments 122 ((made of, for example, $PbTe_{1-w}Se_w$ (w=0~0.5)). It should be noted that the low-temperature thermoelectric segments 121 and the high-temperature thermoelectric segments 122 are bonded via a second fusion-bonding layer 134.

Figure 2:
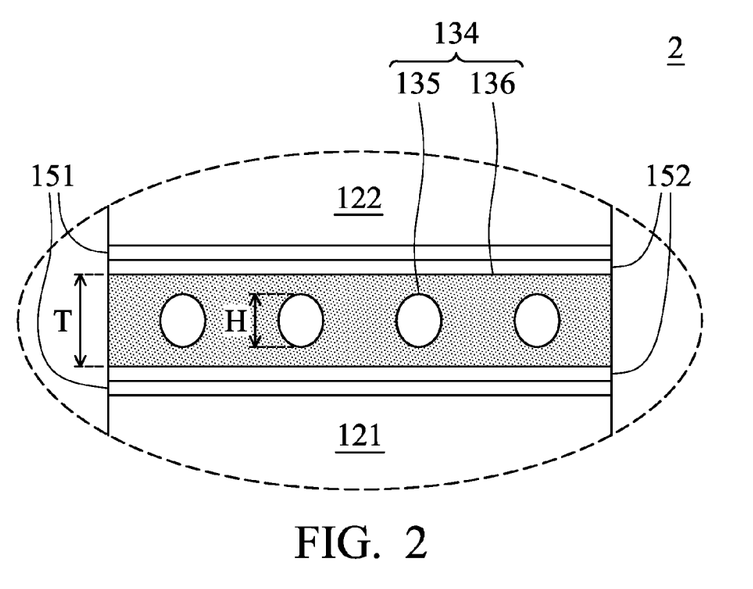
FIG. 2 is a close-up diagram of region 2 of the thermoelectric module 100 of FIG. 1, illustrating two adjacent thermoelectric segments bonded with a fusion-bonding layer.

FIG. 2 is a close-up diagram of region 2 of the thermoelectric module 100 of FIG. 1, illustrating two adjacent thermoelectric segments bonded with a fusion-bonding layer. As shown in FIG. 2, an anti-diffusion layer 151 (such as a Ni layer) and a wetting layer 152 (such as an Ag or Au layer) can be disposed on the top surface of the low-temperature thermoelectric segments 121, and another anti-diffusion layer 151 (such as a Ni layer) and another wetting layer 152 (such as an Ag or Au layer) can be disposed on the bottom surface of the high-temperature thermoelectric segments 122. The fusion-bonding layer 134 is disposed between the two wetting layers 152, wherein the fusion-bonding layer 134 has a thickness T (such as about 100 μm). The fusion-bonding layer 134 includes a tin-containing material 136 (such as a tin-silver-copper alloy layer (including 96 wt % of Sn, 3.5 wt % of Ag, and 0.5 wt % of Cu)), and spacers 135 (such as Ni) with a height of 50 μm and an aspect ratio of about 60 distributed among the tin-containing material 136. It should be noted that the tin-containing material 136 is melted during the hot-pressed bonding process, and then bonded the low-temperature thermoelectric segments 121 and the high-temperature thermoelectric segments 122 after cooling. As a result, the interface made of the fusion-bonding layer 134 exhibits a low electrical resistance.

Since the melting point of the spacers 135 is higher than the liquidus temperature of the tin-containing material 136, the tin-containing material 136 is melted and the spacer still keeps solid state when combining the segmented thermoelectric elements during the hot-pressed bonding process. Therefore, the spacer 135 can ensure that the thickness T of the fusion-bonding layer 134 is higher than or equal to the height of the spacer 135, thus avoiding massive molten tin-containing material 136 overflowing the interface between the thermoelectric segments. Furthermore, the height of the segmented thermoelectric elements (i.e. the p-type segmented thermoelectric elements 110 or the n-type segmented thermoelectric elements 120) can be maintained to be stable. It should be noted that the first and second fusion-bonding layer 130 and 132 can be the same as the fusion-bonding layer 134.

Figure 3:
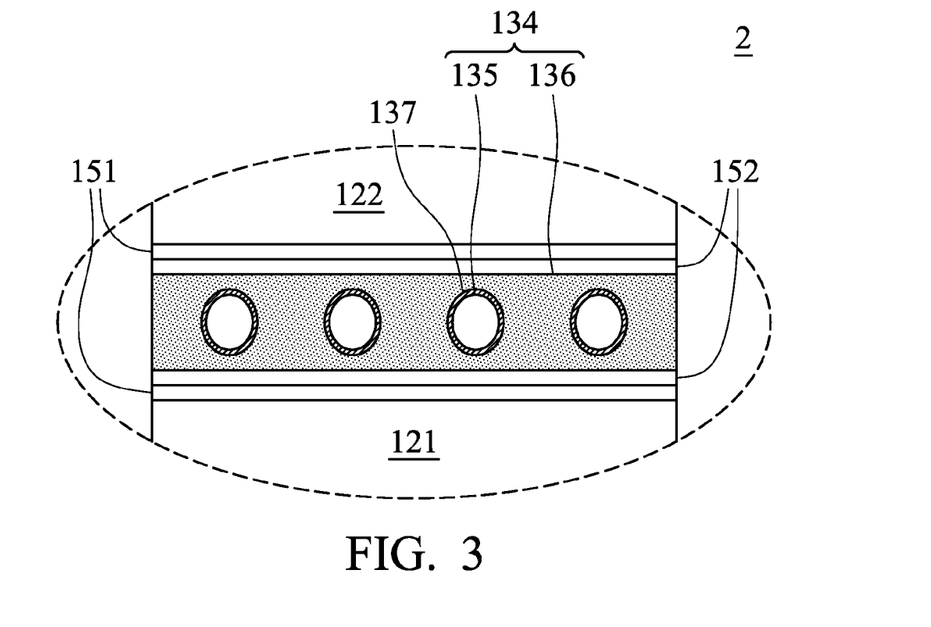
FIG. 3 is a close-up diagram of region 2 of the thermoelectric module 100 of FIG. 1 according to another embodiment of the disclosure.

According to another embodiment of the disclosure, referring to FIG. 3, the spacer 135 can be a particle-shaped spacer (such as nickel particles or copper particles coated with a Ni layer). During the combination of the thermoelectric segments 121 and 122 via the hot-pressed bonding process, the metallic atoms (such as Ni atoms) of the spacer 135 are apt to react with Sn atoms of the melted tin-containing material 136 to form intermetallic compounds such as $Ni_3Sn$, $Ni_3Sn_4$, or $Ni_3Sn_2$. Accordingly, after the hot-pressed bonding process, an intermetallic compound 137 is formed to cover the surface of the spacer 135. Furthermore, the intermetallic compound can be formed independently within the tin-containing material 136 and does not contact with the spacer 135 due to a longer diffusion distance of Ni atoms. It should be noted that, due to the formation of the high-temperature intermetallic compound 137, the amount of the low melting temperature material (such as molten α-Sn) of the tin-containing material 136 (such as tin-silver-copper alloy melt) would be reduced, and as a result, the melting temperature of the fusion-bonding layer 134 can be enhanced after combining the thermoelectric segments 121 and 122. Hence, due to the fusion-bonding layer of the disclosure, the thermoelectric segments can be bonded under a lower temperature, and then the interface of the thermoelectric segments exhibits a higher heat-resistance durability.

Figure 4:
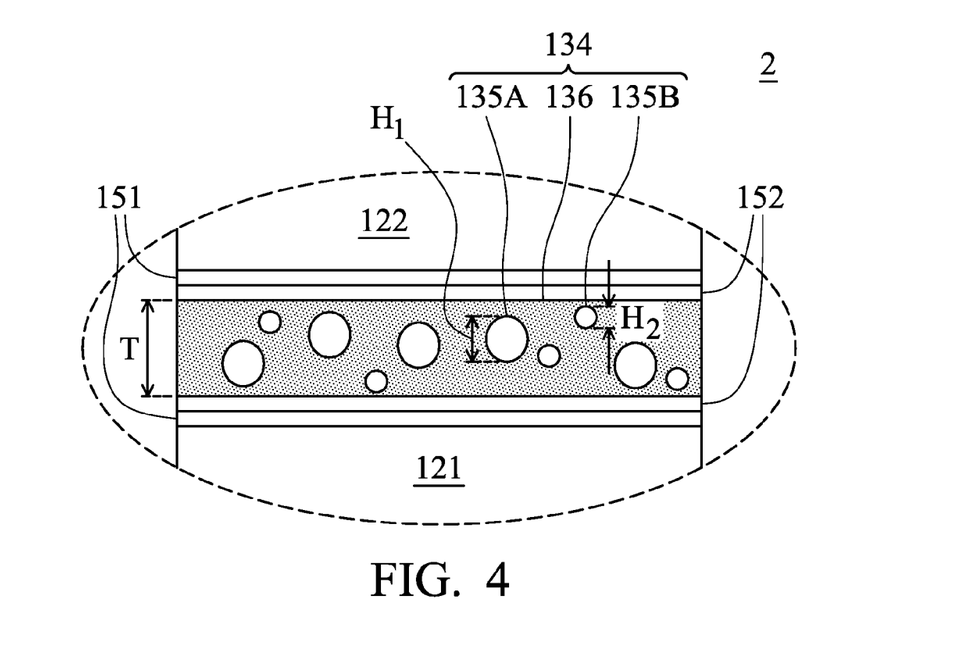
FIG. 4 is a close-up diagram of region 2 of the thermoelectric module 100 of FIG. 1 according to yet another embodiment of the disclosure.

According to another embodiment of the disclosure, referring to FIG. 4, the fusion-bonding layer 134 can include two particle-shaped spacers with distinct particle sizes, wherein the two particle-shaped spacers include a particle-shaped spacer 135A (with a particle size H1 such as 50 μm) and a particle-shaped spacer 135B (with a particle size H2 such as 20 μm).

As shown in FIG. 1, since the p-type thermoelectric material 110 includes three thermoelectric segments 111, 112, and 113, there are two fusion-bonding layers 130 and 132 used to combine the three thermoelectric segments 110, 111, and 112. In this embodiment, the materials of the tin-containing material 136 and the spacer 135 of the first fusion-bonding layer 130 can be the same as those of the second fusion-bonding layer 132. For example, the tin-containing material 136 can be tin-silver-copper alloy (96 wt % of Sn, 3.5 wt % of Ag, and 0.5 wt % of copper), and the spacer 135 can be line-shaped Ni (with a height H of 50 μm). In another embodiment of the disclosure, the second fusion-bonding layer 132 (for combining the high-temperature thermoelectric segment 113 and the mid-temperature thermoelectric segment 112) can be different from the first fusion-bonding layer 130 (for combining the mid-temperature thermoelectric segment 112 and the low-temperature thermoelectric segment 111). In detail, the tin-containing material 136 of the second fusion-bonding layer 132 can have a higher melting point than that of the tin-containing material 136 of the first fusion-bonding layer 130, in order to improve the thermal stability of the second fusion-bonding layer 132 and reduce the hot-pressed bonding process temperature for combining the mid-temperature thermoelectric segment 112 and the low-temperature thermoelectric segment 111. For example, the tin-containing material 136 of the second fusion-bonding layer 132 can have a lower Sn content and a higher Ag content, and the tin-containing material 136 of the first fusion-bonding layer 130 can have a higher Sn content and a lower Ag content.

Figure 5:
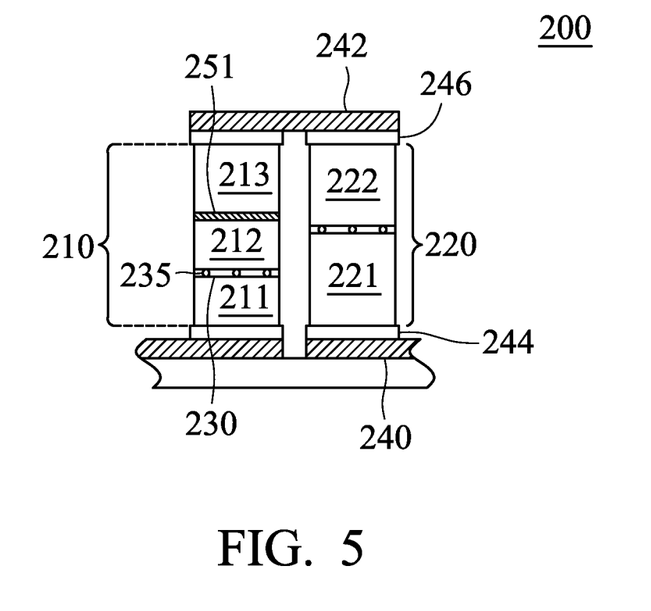
FIG. 5 is a cross-section of a thermoelectric module 200 according to another embodiment of the disclosure.

In some embodiments of the disclosure, referring to FIG. 5, the thermoelectric module 200 further includes a first electrode 240 and a second electrode 242, wherein the p-type segmented thermoelectric element 210 and the n-type segmented thermoelectric element 220 is bonded on the first electrode 240 via the first soldering layer 244, and the p-type segmented thermoelectric element 210 and the n-type segmented thermoelectric element 220 is bonded with the second electrode 242 via the second soldering layer (for example, a brazing layer) 246. The p-type segmented thermoelectric element 210 and the n-type segmented thermoelectric element 220 are coupled in series via the first electrode 240 and the second electrode 242. Still referring to FIG. 5, the p-type segmented thermoelectric element 210 includes three thermoelectric segments 211, 212, and 213, wherein the low-temperature thermoelectric segments 211 and the mid-temperature thermoelectric segments 212 are combined by the fusion-bonding layer 230, and the fusion-bonding layer 230 includes a spacer 235. Furthermore, the high-temperature thermoelectric segment 213 and the mid-temperature thermoelectric segment 212 are combined by powder sintering, and an anti-diffusion layer 251 (with a thickness of 500~1000 μm) is disposed between the high-temperature thermoelectric segments 213 and the mid-temperature thermoelectric segments 212. The method for forming the p-type segmented thermoelectric element 210 includes the following steps. A Fe (or Ni) powder (for forming an anti-diffusion layer, not shown), a high temperature thermoelectric powder material (for forming the high-temperature thermoelectric segments 213), a Ni powder (for forming the anti-diffusion layer 251), a mid-temperature thermoelectric powder material (for forming the mid-temperature thermoelectric segments 212) and a Ni (or Fe) powder (for forming the anti-diffusion layer, not shown) are sequentially added to a steel mold and subjected to a sintering process under high pressure, thereby combining the high-temperature thermoelectric segment 213 and the mid-temperature thermoelectric segment 212. Next, the obtained thermoelectric segment and a low temperature thermoelectric material 211 are stacked together (the mid-temperature thermoelectric segment 212 is in contact with the low temperature thermoelectric material 211), wherein a fusion bonding material is disposed in the interface between the obtained thermoelectric segment and the low temperature thermoelectric material 211 and subjected to a hot-pressed bonding process. After melting the fusion bonding material via the hot-pressed bonding process, the fusion bonding material is cooled down to solidify and form the fusion-bonding layer 230.

Formation of the Segmented Thermoelectric Elements

Figure 6A:
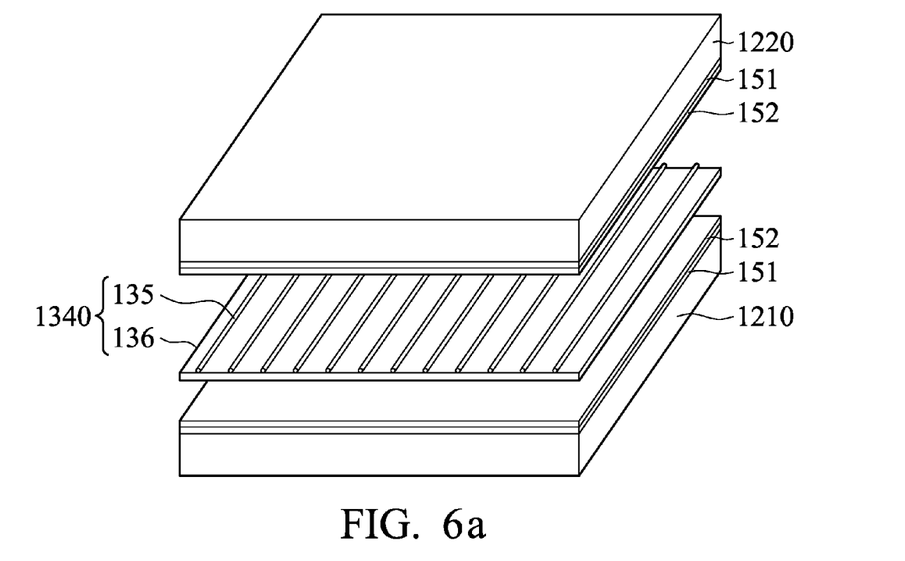
FIGS. 6a-6c are a series of cross-sections illustrating the method for forming a plurality of n-type segmented thermoelectric elements.
Figure 6B:
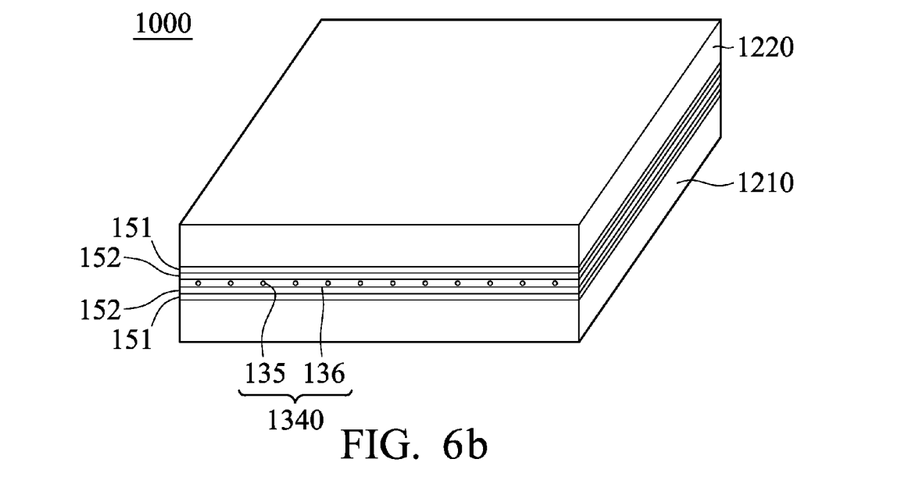
Figure 6C:
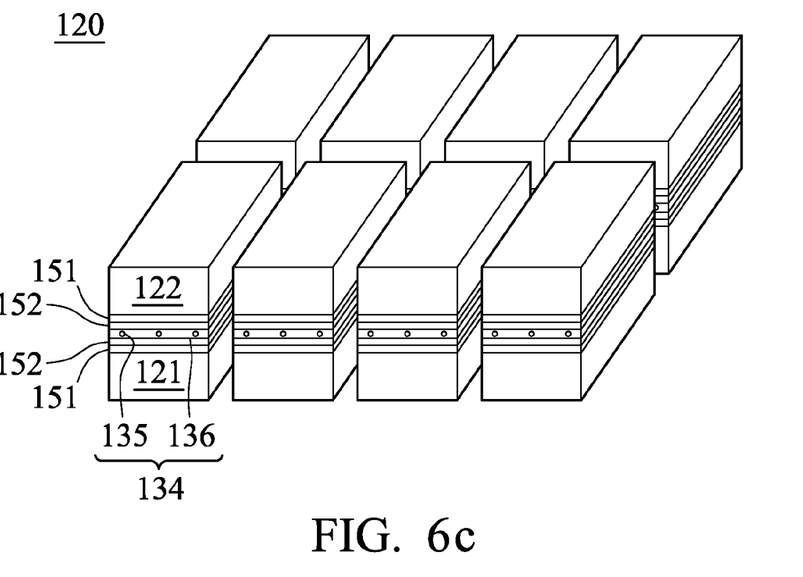

FIGS. 6a-6c are a series of cross-sections, illustrating the method for forming a plurality of thermoelectric segments (take the n-type segmented thermoelectric element 120 of FIG. 1 for example). Furthermore, the p-type segmented thermoelectric element can be fabricated by the method as disclosed in FIGS. 6a-6c. First, as shown in FIG. 6a (a diagram illustrating the low-temperature thermoelectric segment block 1210, the connection layer 1340, and the high-temperature thermoelectric segment block 1220 before the hot-pressed bonding process), a low-temperature thermoelectric segment block 1210 (such as $Bi_2Te_{2.55}Se_{0.45}$) is disposed opposite to a high-temperature thermoelectric segment block 1220 (such as PbTe), and a connection layer 1340 is disposed between the low-temperature thermoelectric segment block 1210 and the high-temperature thermoelectric segment block 1220, wherein the low-temperature thermoelectric segment block 1210 and the high-temperature thermoelectric segment block 1220 both have an anti-diffusion layer 151 (such as a Ni layer) and a wetting layer 152 (such as a Au layer) disposed on the surface thereof, wherein the wetting layer 152 of the low-temperature thermoelectric segment block 1210 is opposite to the high-temperature thermoelectric segment block 1220. The fusion-bonding layer 1340 includes a tin-containing material 136, wherein spacers 135 are uniformly distributed on the top surface of the tin-containing material 136. The tin-containing material 136 can be a tin-silver-copper alloy foil (96 wt % of Sn, 3.5 wt % of Ag, 0.5 wt % of Cu) with a thickness of about 100 μm, and the spacers 135 can be a line-shaped Ni—Cr alloy (with a diameter of 50 μm).

Next, as shown in FIG. 6b, the low-temperature thermoelectric segment block 1210, the fusion-bonding layer 1340, and the high-temperature thermoelectric segment block 1220 are combined via a bonding process (such as a hot-pressed bonding process), wherein the process temperature of the hot-pressed bonding process is higher than the initial melting temperature of the tin-containing material 136 (such as a tin-silver-copper alloy foil (96 wt % of Sn, 3.5 wt % of Ag, 0.5 wt % of copper)) of the fusion-bonding layer 1340. Meanwhile, since the melting point (1455° C. of Ni) of the spacer 135 is higher than the liquidus temperature of the tin-containing material 136, the spacer is solid and thus has the function of shoring up the connection layer 1340 during the hot-pressed bonding process. Therefore, the spacer 135 can prevent the molten tin-containing material 136 from overflowing the interface between the low-temperature thermoelectric segment block 1210 and the high-temperature thermoelectric segment block 1220, and help maintain the height of the connection layer 1340 to be nearly constant and function as stabilizing the connection layer during the hot-pressed bonding process and also the service operation.

The tin-containing material 136 of the fusion-bonding layer 1340 can be partially or completely melted during the hot-pressed bonding process, and the fusion-bonding layer 1340 can be bonded with the thermoelectric segment blocks via a metallurgical bonding. According to another embodiment, the thermoelectric segment block 1210 can be a mid-temperature thermoelectric segment block (such as $\beta\text{-}Zn_4Sb_3$), and the thermoelectric segment block 1220 can be a high-temperature thermoelectric segment block (such as PbTe). The connection layer 1340 can include a silver foil having a total thickness of 200 μm and coated with Sn film (serving as the tin-containing material 136), and Ni particles (having a particle size of 10-120 μm) disposed on the surface of the tin-containing material 136.

During the hot-pressed bonding process, the silver foil coated with Sn film is partially melted at 260° C.~300° C. to form a tin-containing melt, and the Ni particles are embedded into the connection layer 1340. Meanwhile, the tin-containing melt reacts with the wetting layers 152 formed on the thermoelectric segment blocks 1210 and 1220, thereby combining the thermoelectric segment blocks 1210 and 1220 via the connection layer 1340. In this embodiment, the spacers 135 can be previously disposed on the surface of the tin-containing material 136 before the hot-pressed bonding process, and then embedded into the tin-containing material 136 after the hot-pressed bonding process. According to another embodiment, the spacers 135 can be previously embedded into the tin-containing material 136. For example, 8 vol. % of the spacers 135 (Ni powder with a particle size of 10-60 μm) can be mixed with a tin-containing solder (such as a tin-silver-copper solder) in advance, and then the mixture can be coated onto the wetting layers 152 formed on the thermoelectric segment blocks 1210 and 1220 before the hot-pressed bonding process.

Next, as shown in FIG. 6c, after combining the thermoelectric segment blocks 1210 and 1220 via the hot-pressed bonding process, the segmented thermoelectric block 100 can be diced to obtain a plurality of n-type segmented thermoelectric elements 120. Furthermore, the p-type segmented thermoelectric element 110 of FIG. 1 can also be fabricated using the aforementioned method for fabricating n-type segmented thermoelectric elements 120.

In one embodiment, the fusion-bonding layer includes a spacer having a melting point higher than the liquidus temperature of the tin-containing material, thereby preventing the massive melting tin-containing material from overflowing the interface severely between the two adjacent thermoelectric segments under the clamp force of the hot-pressed bonding process. In other embodiment, the spacers of the fusion-bonding layer can help maintain the height consistency of the segmented thermoelectric elements and help stabilize the thickness of the fusion-bonding layer during the hot-pressed bonding process or the over-temperature operation of the thermoelectric module. Therefore, the yield of fabricating the segmented thermoelectric elements can be increased, and the heat-softening fusion-bonding layer can also help prevent the segmented thermoelectric elements from being damaged by shear thermal stress during the over-temperature operation. In another embodiment, while combining the thermoelectric segments via the hot-pressed bonding process, the metallic atoms of the spacer are apt to react with Sn atoms of the melted tin-containing material to form intermetallic compounds such as $Ni_3Sn$, $Ni_3Sn_4$, or $Ni_3Sn_2$, this Sn consumption will increase the melting temperature of the fusion-bonding layer after the hot-pressed bonding process. Accordingly, due to the fusion-bonding layer of the embodiment, the thermoelectric segments can be bonded under a lower temperature fusion process without the risk of the thermoelectric performance deterioration of the segmented thermoelectric elements/materials, the generation efficiency of the thermoelectric module can be improved.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A thermoelectric module, comprising:
    a plurality of p-type and n-type segmented thermoelectric elements disposed in a planar array, wherein the p-type and n-type segmented thermoelectric elements are coupled in series via a plurality of first electrodes and second electrodes, and each segmented thermoelectric element includes at least two vertically homogeneous thermoelectric segments, and the two adjacent thermoelectric segments of the at least two vertically homogeneous thermoelectric segments have a fusion-bonding layer therebetween, and wherein the fusion-bonding layer comprises:
        a tin-containing material; and
        a plurality of spacers disposed among the tin-containing material, wherein the spacers are made of Fe, Co, Ni, Cr, Ti, Mn, Ag, Cu, or a combination thereof, and the melting point of the spacers is higher than the liquidus temperature of the tin-containing material, and wherein the spacers are strip-shaped and have an aspect ratio between 20 and 500.

2. The thermoelectric module as claimed in claim 1, wherein a ratio between the height of the strip-shaped spacer and the thickness of the fusion-bonding layer is from 0.5 to 1.

3. The thermoelectric module as claimed in claim 1, wherein the spacers are a metallic material having a surface covered with Fe, Co, Ni, Cr, Ti, Mn, Ag, or Cu, or a ceramic material having a surface covered with Fe, Co, Ni, Cr, Ti, Mn, Ag, or Cu.

4. The thermoelectric module as claimed in claim 1, wherein the each segmented thermoelectric element sequentially comprises a high-temperature thermoelectric segment, a mid-temperature thermoelectric segment, and a low-temperature thermoelectric segment.

5. The thermoelectric module as claimed in claim 4, wherein an anti-diffusion layer is disposed between the high-temperature thermoelectric segment and the mid-temperature thermoelectric segment, and the fusion-bonding layer is disposed between the mid-temperature thermoelectric segment and the low-temperature thermoelectric segment.

6. The thermoelectric module as claimed in claim 4, wherein a first fusion-bonding layer is disposed between the mid-temperature thermoelectric segment and the low-temperature thermoelectric segment, and a second fusion-bonding layer is disposed between the high-temperature thermoelectric segment and the mid-temperature thermoelectric segment.

7. The thermoelectric module as claimed in claim 6, wherein the melting point of the tin-containing material of the second fusion-bonding layer is higher than that of the tin-containing material of the first fusion-bonding layer.

8. The thermoelectric module as claimed in claim 1, wherein the fusion-bonding layer comprises the tin-containing material, wherein a host atom of the tin-containing material is a Sn, Pb, Cu, or Ag atom.

9. The thermoelectric module as claimed in claim 1, wherein the fusion-bonding layer further comprises intermetallic compounds accreted onto the surface of the spacer, or dispersed within the tin-containing material adjacent to the spacer.

10. The thermoelectric module as claimed in claim 9, wherein the intermetallic compounds include $Ni_3Sn$, $Ni_3Sn_4$, $Ni_3Sn_2$, $Cr_2Sn_3$, $Co_3Sn_2$, $CoSn$, $CoSn_2$, $Co_3Sn$, $Fe_5Sn_3$, $Fe_3Sn_2$, $FeSn$, $FeSn_2$, $Fe_3Sn$, $Ti_3Sn$, $Ti_2Sn$, $Ti_5Sn_3$, $Ti_6Sn_5$, $Mn_2Sn$, $Mn_3Sn$, $Ag_5Sn$, $Ag_3Sn$, or $Cu_5Sn_6$.

11. The thermoelectric module as claimed in claim 4, wherein the low-temperature thermoelectric segment of the p-type segmented thermoelectric element comprises $Bi_xSb_{2-x}Te_3$, and x is 0.35-0.65.

12. The thermoelectric module as claimed in claim 4, wherein the mid-temperature thermoelectric segment of the p-type segmented thermoelectric element comprises $Zn_4Sb_3$.

13. The thermoelectric module as claimed in claim 4, wherein the low-temperature thermoelectric segment of the n-type segmented thermoelectric element comprises $Bi_2Te_{3-y}Se_y$, and y is 0.1-0.9.

14. A method for fabricating thermoelectric modules, comprising:
    providing a plurality of p-type segmented thermoelectric elements, and a plurality of n-type segmented thermoelectric elements, wherein each segmented thermoelectric element comprises at least two thermoelectric segments vertically stacked together, wherein a fusion-bonding layer is disposed between two adjacent thermoelectric segments of the at least two homogeneous vertically stacked together, and the fusion-bonding layer comprises a tin-containing material, and a plurality of spacers disposed among the tin-containing material, wherein the spacers are made of Fe, Co, Ni, Cr, Ti, Mn, Ag, Cu, or a combination thereof, and the melting point of the spacers is higher than the liquidus temperature of the tin-containing material and wherein the spacers are strip-shaped and have an aspect ratio between 20 and 500;
    alternately arranging the p-type segmented thermoelectric elements and the n-type segmented thermoelectric elements to form a planar array; and
    providing a plurality of first electrodes to contact bottom ends of the p-type segmented thermoelectric elements and the n-type segmented thermoelectric elements, and providing a plurality of second electrodes to contact top ends of the p-type segmented thermoelectric elements and the n-type segmented thermoelectric elements, forcing the p-type segmented thermoelectric elements to couple to the n-type segmented thermoelectric elements in series.

15. The method as claimed in claim 14, wherein a method for forming the p-type segmented thermoelectric element or the n-type segmented thermoelectric element comprises:

disposing a tin-containing material and spacers between two thermoelectric segments; and performing a hot-pressed bonding process to the two thermoelectric segments to form the fusion-bonding layer for connecting the two thermoelectric segments.

16. The method as claimed in claim 14, wherein the p-type or n-type segmented thermoelectric element sequentially comprises a high-temperature thermoelectric segment, a mid-temperature thermoelectric segment, and a low-temperature thermoelectric segment, wherein the high-temperature thermoelectric segment and the mid-temperature thermoelectric segment are bonded by a powder sintering process, and the mid-temperature thermoelectric segment and the low-temperature thermoelectric segment are bonded by the fusion-bonding layer.

17. The method as claimed in claim 14, wherein the p-type or n-type segmented thermoelectric element sequentially comprises a high-temperature thermoelectric segment, a mid-temperature thermoelectric segment, and a low-temperature thermoelectric segment, wherein the low-temperature thermoelectric segment and the mid-temperature thermoelectric segment are bonded by a first fusion-bonding layer, and the mid-temperature thermoelectric segment and the high-temperature thermoelectric segment are bonded by a second fusion-bonding layer.

18. The method as claimed in claim 14, wherein the p-type or n-type segmented thermoelectric element sequentially comprises a mid-temperature thermoelectric segment and a low-temperature thermoelectric segment, wherein the mid-temperature thermoelectric segment and the low-temperature thermoelectric segment are bonded by the fusion-bonding layer.

* * * * *